(12) United States Patent  
Pellens et al.

(10) Patent No.: US 7,413,942 B2
(45) Date of Patent: Aug. 19, 2008

(54) T-GATE FORMATION

(75) Inventors: Rudy Pellens, Overpelt (BE); Frank Linskens, Venray (NL)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 413 days.

(21) Appl. No.: 11/046,045

(22) Filed: Jan. 28, 2005

(65) Prior Publication Data

US 2005/0202613 A1 Sep. 15, 2005
US 2006/0223245 A9 Oct. 5, 2006

Related U.S. Application Data

(60) Provisional application No. 60/539,932, filed on Jan. 29, 2004.

(51) Int. Cl.
*H01L 21/338* (2006.01)
(52) U.S. Cl. ........................ 438/182; 438/574
(58) Field of Classification Search ............ 438/172, 438/182, 574, 578, 579; 257/267, 283, 330, 257/332; 430/22, 312, 315
See application file for complete search history.

(56) References Cited

U.S. PATENT DOCUMENTS

| | | | |
|---|---|---|---|
| 4,679,311 A | 7/1987 | Lakhani et al. | |
| 4,923,827 A | 5/1990 | Calviello et al. | |
| 4,997,778 A | 3/1991 | Sim et al. | |
| 5,334,542 A | 8/1994 | Saito et al. | |
| 5,543,253 A | 8/1996 | Park et al. | |
| 5,563,079 A * | 10/1996 | Shin et al. | 438/571 |
| 5,856,232 A | 1/1999 | Yang et al. | |
| 5,858,824 A | 1/1999 | Saitoh et al. | |
| 5,876,901 A | 3/1999 | Ishimaru | |
| 5,930,610 A | 7/1999 | Lee | |
| 5,940,697 A | 8/1999 | Yoo et al. | |
| 6,114,082 A | 9/2000 | Hakey et al. | |
| 6,139,995 A * | 10/2000 | Burm et al. | 430/22 |
| 6,153,499 A | 11/2000 | Anda et al. | |
| 6,255,035 B1 * | 7/2001 | Minter et al. | 430/312 |
| 6,255,202 B1 | 7/2001 | Lyons et al. | |
| 6,294,446 B1 | 9/2001 | Ishikawa | |
| 6,319,802 B1 | 11/2001 | Subramanian et al. | |
| 6,387,783 B1 | 5/2002 | Furukawa et al. | |
| 6,403,456 B1 | 6/2002 | Plat et al. | |
| 6,417,084 B1 | 7/2002 | Singh et al. | |
| 6,509,253 B1 | 1/2003 | Yu | |
| 6,784,081 B1 * | 8/2004 | Hsu et al. | 438/574 |
| 2002/0048858 A1 | 4/2002 | Furukawa et al. | |

FOREIGN PATENT DOCUMENTS

JP 20012266324 A 8/2001

* cited by examiner

*Primary Examiner*—David Vu
(74) *Attorney, Agent, or Firm*—S. Matthew Cairns

(57) ABSTRACT

Methods of forming T-gate structures on a substrate are provided that use only UV-sensitive photoresists. Such methods provide T-gate structures using two lithographic steps using a single wavelength of radiation.

16 Claims, 6 Drawing Sheets

T-GATE FORMATION

CROSS-REFERENCE TO RELATED APPLICATION

This application claims the benefit under 35 U.S.C. § 119(e) of U.S. Provisional Application No. 60/539,932, filed Jan. 29, 2004, the entire contents of which are incorporated herein by reference.

BACKGROUND OF THE INVENTION

The present invention relates generally to the manufacture of electronic devices. More particularly, the present invention relates to the fabrication of T-gate structures used in the manufacture of electronic devices.

A T-gate is a gate conductor structure for a semiconductor device in which the top of the gate conductor structure is wider than the base of the gate conductor structure. Such T-gates include, without limitation, structures that are substantially T-shaped, mushroom-shaped, and Y-shaped.

In general, gate structures such as T-gates have been advantageously used in several technologies. For example, metal semiconductor field effect transistors ("MESFETs"), high electron mobility transistors ("HEMTs") (variant of gallium arsenide field effect transistor technology) mainly used in satellite broadcasting receivers, high speed logic circuits and power modules have employed gate structures with bases smaller than the contact area. These types of gate structures are required in field effect transistors for operation in ultra-high frequency ranges. The narrow base of a T-gate structure provides a short channel length which results in increased speed and decreased power consumption. Parasitic resistances and capacitances that limit device speed are also reduced. The top portion of a T-gate is made wide so that the conductance of the T-gate remains high, for example, for high switching speeds.

Recent advances in CMOS transistor architecture make use of T-gate structures where the polysilicon gate electrode is narrowed in the gate regions and wider on top of the gate. This is due to the ever increasing demand for scaling down semiconductor devices and scaling down power consumption requirements.

Electron-beam ("e-beam") is the most commonly used technique for T-gate fabrication. FIGS. 1A-1D illustrate a process for forming a T-gate using e-beam. Typically, substrate 1 is coated with a layer of first poly(methyl methacrylate)-based photoresist 2, a layer of second poly(methyl methacrylate)-based photoresist 3, and a layer of third poly(methyl methacrylate)-based photoresist 4. Photoresist layers 2 to 4 are then exposed to e-beam and developed to provide a patterned photoresist stack having generally T-shaped profile 5 as shown in FIG. 1B. A layer of a conductive material 6 is then deposited on the entire surface inclusive of the surface of substrate 1 exposed by the patterning of the photoresist layers, see FIG. 1C. Photoresist layers 2 to 4 are then removed, lifting-off the conductive material layer on the surface of photoresist layer 4 in the process, to provide T-gate structure 7 on substrate 1 as shown in FIG. 1D.

However, such e-beam techniques suffer from certain drawbacks. For example, e-beam lithography suffers from poor linewidth control in the multi-layered stacks used in typical T-gate processes because the exposing e-beam must pass through relatively thick resist films (e.g., about one micron). Further, e-beam exposure is a direct write process which is both slow and expensive.

Other methods of forming T-gates have been developed. Certain of these methods utilize a number of sacrificial inorganic layers which require various etching steps and harsher removal processes than photoresist-based processes. Other methods utilize multiple photoresist layers, however, these multiple photoresist layers are imaged at different wavelengths. For example, U.S. Pat. No. 6,387,783 (Furukawa et al.) disclose a process for forming T-gates using a hybrid first photoresist that is imaged using x-rays and a second photoresist that is imaged using I-line radiation. The use of such different wavelengths requires different exposure tools, which increase the costs and complexity of the process. Accordingly, a need exists for improved methods of forming T-gate structures.

SUMMARY OF THE INVENTION

The inventors have found that T-gate structures may be formed using conventional UV exposure tools using a single wavelength and with fewer processing steps.

The present invention provides a method for forming a T-gate on a substrate including the steps of: a) providing a substrate; b) optionally disposing an organic planarizing layer on the substrate; c) disposing a layer of a UV-sensitive first photoresist; d) patterning the first photoresist by exposing the first photoresist to UV radiation through a mask and developing the exposed first photoresist to define a first opening for a base of the T-gate; e) transferring the pattern to the planarizing layer if present; f) rendering the pattern insensitive to the UV-radiation; g) disposing a layer of a UV-sensitive second photoresist, the second photoresist being negative-acting; h) patterning the second photoresist by exposing the second photoresist to the UV radiation through a mask and developing the exposed second photoresist to define a second opening for a cap of the T-gate over the first opening; and i) depositing a conductive material within the first and second openings to form a T-gate.

The present invention further provides a method for forming a T-gate structure comprising the steps of: a) providing a substrate; b) disposing an organic planarizing layer on the substrate, disposing a layer of a UV-sensitive first photoresist on the organic planarizing layer, patterning the first photoresist by exposing the first photoresist to UV radiation through a mask and developing the exposed first photoresist to define a first opening for a base of the T-gate, transferring the first opening to the organic planarizing layer, and optionally removing the first photoresist to provide a patterned organic planarizing layer; c) disposing a layer of a UV-sensitive second photoresist wherein the second photoresist is negative-acting; d) patterning the second photoresist by exposing the second photoresist to the UV radiation through a mask and developing the exposed second photoresist to define a second opening for a cap of the T-gate over the first opening; e) depositing a conductive material within the first and second openings to form a T-gate; and f) removing the second photoresist. Preferably, the organic planarizing layer is an anti-reflective coating layer.

Additionally, the present invention provides a method for forming a T-gate structure comprising the steps of: a) providing a substrate; b) disposing a layer of a UV-sensitive first photoresist on the substrate; patterning the first photoresist by exposing the first photoresist to UV radiation through a mask and developing the exposed first photoresist to define a first opening for a base of the T-gate; and curing the patterned first photoresist; c) disposing a layer of a UV-sensitive second photoresist on the cured first photoresist wherein the second photoresist is negative-acting; d) patterning the second photoresist by exposing the second photoresist to the UV radiation through a mask and developing the exposed second photoresist to define a second opening for a cap of the T-gate over the first opening; e) depositing a conductive material within the first and second openings to form a T-gate; and f) removing the first and second photoresists.

DETAILED DESCRIPTION OF THE INVENTION

Figure 1A:
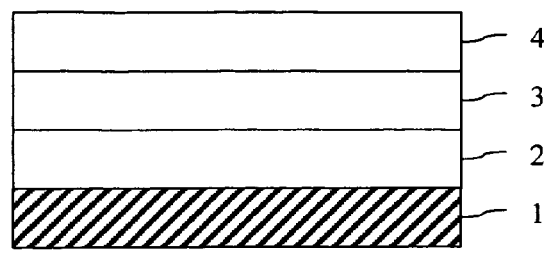
FIGS. 1A-1D are a schematic cross-sectional illustration of a conventional process for T-gate formation using e-beam.
Figure 1B:
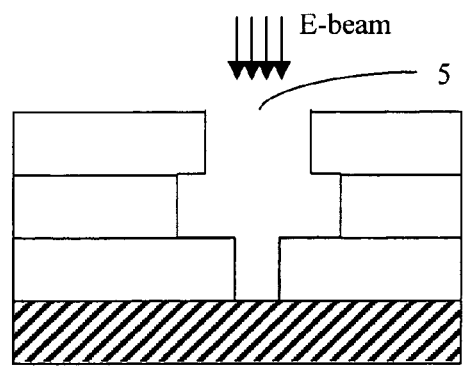
Figure 1C:
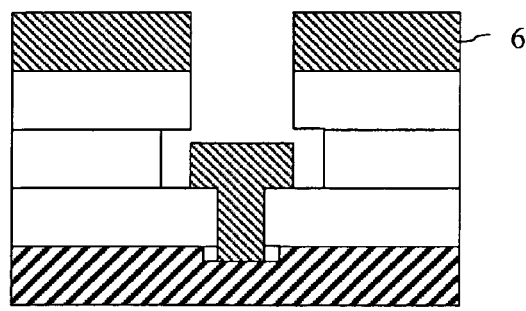
Figure 1D:
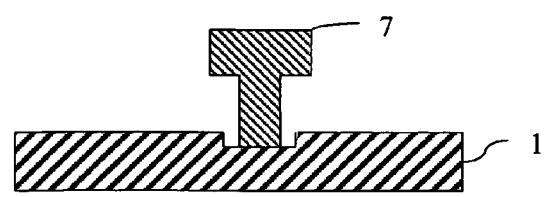

As used throughout this specification, the term "T-gate" refers to any gate conductor structure for an electronic device in which the top of the gate conductor structure is wider than the base of the gate conductor structure. Such T-gate structures may have a variety of shapes including, without limitation, T-shaped, mushroom-shaped, and Y-shaped. The articles "a" and "an" refer to the singular and the plural. All numerical ranges are inclusive and combinable in any order except where it is clear that such numerical range is constrained to add up to 100%. Like reference numerals refer to like elements.

T-gate structures are formed on a substrate according to the present method using two lithographic processes, the two lithographic processes being performed using the same wavelength of radiation. A negative-acting photoresist is typically used as the photoresist in the second lithographic process. An advantage of the present invention is that a single exposure tool can be utilized instead of multiple tools, thus reducing costs. Accordingly, the present invention provides a method for forming a T-gate structure including the steps of: a) providing a substrate; b) optionally disposing an organic planarizing layer on the substrate; c) disposing a layer of a UV-sensitive first photoresist; d) patterning the first photoresist by exposing the first photoresist to UV radiation through a mask and developing the exposed first photoresist to define a first opening for a base of the T-gate; e) transferring the pattern to the planarizing layer if present; f) rendering the pattern insensitive to the UV-radiation; g) disposing a layer of a UV-sensitive second photoresist, the second photoresist being negative-acting; h) patterning the second photoresist by exposing the second photoresist to the UV radiation through a mask and developing the exposed second photoresist to define a second opening for a cap of the T-gate over the first opening; and i) depositing a conductive material within the first and second openings to form a T-gate. The remaining photoresist layers are then removed and function as lift-off layers by removing the conductive material deposited on the surface of the second photoresist. The wavelength of the UV radiation used to image the first and second photoresists is the same.

A wide variety of substrates may be used in the present invention. Suitable substrates are those used in the manufacture of electronic devices. Exemplary substrates include, without limitation, gallium arsenide ("GaAs"), silicon ("Si"), indium gallium arsenide ("InGaAs"), aluminum gallium arsenide ("AlGaAs"), strained silicon, silicon germanium ("SiGe"), and mixtures thereof. Other suitable substrates are well known to those skilled in the art. For example, the substrate may include an InGaAs/AlGaAs/GaAs film stack grown on a semi-insulating GaAs substrate. Such films may be grown by a variety of means, such as by molecular beam epitaxy ("MBE"), metalorganic chemical vapor deposition ("MOCVD"), physical vapor deposition ("PVD"), liquid phase epitaxy ("LPE"), chemical beam epitaxy ("CBE") and atomic layer deposition ("ALD"). These film growth techniques are well known to those skilled in the art. The substrates may include one or more additional layers of materials. The choice of such substrates will depend upon the particular electronic device desired and is well within the ability of those skilled in the art.

The optional organic planarizing layers that may be used in the present invention include, but are not limited to, one or more layers of via-filling material, antireflective coatings and mixtures thereof. Via-filling materials typically contain one or more cross-linkable polymers, particularly low molecular weight polymers such as those having a weight average molecular weight of less than or equal to about 8000 and a value of $M_w/M_n$ of at least 1.5, one or more acid catalysts, one or more cross-linking agents and one or more solvents. Such via-filling materials are typically used to fill apertures to protect such apertures from damage during subsequent processing steps. It will be appreciated by those skilled in the art that such via-filling materials may also function as antireflective coatings upon the inclusion of one or more chromophores. Exemplary via-filling materials are disclosed in U.S. Pat. No. 6,461,717.

The antireflective coating is typically an organic antireflective coating. Such antireflective coatings contain one or more light absorbing materials. Such materials may be bound to a polymer or may be admixed with a polymer or incorporated by any other suitable means. Exemplary light absorbing materials include, without limitation, phenyl and anthracenyl, each optionally substituted. The selection of an antireflective coating depends upon the particular wavelength of UV radiation and the photoresist employed. Such selection is within the abilities of those skilled in the art. Multiple layers of antireflective coatings may optionally be used. Exemplary antireflective coating materials are disclosed in U.S. Pat. Nos. 6,528,235; 6,472,128; 6,451,503; 6,165,697; and 5,851,730.

The optional planarizing layer may be disposed on the substrate by any suitable means, such as spin coating, roller coating, curtain coating, dipping, and spraying. Spin coating is conventionally used. The thickness of the planarizing layer is determined by the spin speed in the case of spin coating, and by the viscosity of the planarizing material composition. In general, the planarizing layer, particularly an antireflective coating layer, has a thickness of up to 500 nm, although greater thicknesses may be used. Typically, the thickness of the planarizing layer ranges from 100 to 500 nm, more typically from 150 to 300 nm, and still more typically from 200 to 300 nm. Following deposition, the planarizing material is typically baked to remove solvent and then sufficiently cured by any suitable means to prevent intermixing with the subsequently deposited first photoresist.

A wide variety of UV-sensitive photoresists may be used as the first photoresist, such as positive-acting and negative-acting photoresists. Chemically amplified positive photoresists suitably contain a component that has moieties that undergo a deblocking or cleavage reaction in the presence of photogenerated acid, such as photoacid-labile esters or acetals. Positive acting photoresists for sub-300 nm imaging such as 248 nm include a photoacid generator compound such as an iodonium or sulfonium salt and a polymer that comprises phenolic units (or silsesquioxane units or both phenolic units and silsesquioxane units) and acid-labile ester and/or acetal moieties. Exemplary positive-acting photoresists are disclosed in, e.g., U.S. Pat. Nos. 6,042,997; 6,090,526; 5,929, 176; and 5,492,793.

Negative-acting photoresists for sub-300 nm imaging such as 248 nm typically include a phenolic resin or a silsesquioxane polymer or blends thereof or copolymers containing both phenolic units and silsesquioxane units, a photoacid generator compound such as an iodonium or sulfonium salt, and a cross-linking agent. Suitable negative-acting photoresist cross-linkers include, without limitation, amine-based cross-linkers such as melamine resins. Exemplary negative-acting photoresists are disclosed in, e.g., U.S. Pat. Nos. 5,514,520; 5,340,696; and 5,210,000, and European Published Application EP 042 391.

The term "silsesquioxane" refers to polymers, oligomers, and partial condensates having the formula $(RSiO_{1.5})$ where R is an organic moiety such as $(C_1-C_6)$alkyl and phenyl, either being optionally substituted. By "substituted" it is meant that one or more hydrogens on the alkyl or phenyl group is replaced by one or more substituent groups, such as hydroxyl, $(C_1-C_6)$alkoxy, $(C_1-C_6)$alkyl, alkoxyalkyl, $(C_7-C_{16})$aralkyl, and the like. Exemplary phenolic resins include, without limitation, novolak resins and hydroxystyrene resins. Exemplary silsesquioxane-containing photoresists are those disclosed in U.S. Pat. Nos. 4,745,169 and 5,338,818, and U.S. patent application Ser. No. 2003/0099899.

Any UV-sensitive negative-acting photoresist may suitably be used as the second photoresist in the present invention. Exemplary second photoresists include, without limitation, the negative-acting photoresists described above.

Exemplary positive-acting and negative-acting photoresists for use in the present invention are SR™2420 and UVN™30, respectively, both available from Shipley Company (Marlborough, Mass.).

Such first and second photoresists may be imaged at a variety of wavelengths, such as from 190 to 365 nm. Typically, the photoresists are imaged at wavelengths of 190 to 300 nm, and more typically at 248 nm. The first and second photoresists are preferably selected such that they are both imaged at the same wavelength of UV radiation.

The first and second photoresists may be disposed by any suitable means, such as spin coating, roller coating, curtain coating, dipping, and spraying. Spin coating is conventionally used. The thickness of the photoresist layer is determined by the spin speed in the case of spin coating, and by the viscosity of the photoresist. In general, the first photoresist layer has a thickness of up to 500 nm, although other thicknesses may be used. Typically, the first photoresist layer thickness ranges from 100 to 500 nm, more typically from 100 to 300 nm and still more typically from 150 to 250 nm. The second photoresist layer typically has a thickness of up to 1 μm (micron), although other thicknesses may suitably be employed. In one embodiment, the second photoresist layer has a thickness range of 300 nm to 1 μm, more typically from 500 nm to 900 nm, and still more typically from 600 to 800 nm. In general, the second photoresist layer has a thickness greater than that of the first photoresist layer.

The photoresists are patterned by exposing the photoresists to suitable UV radiation through a mask, followed by development. A wide variety of exposure tools may be used with the present process. Suitable exposure tools are those manufactured by ASML (Veldhoven, the Netherlands), such as a PAS5500/300 tool. The exposure time and the exposure dose depend upon a variety of factors, such as the particular photoresist selected, and are well within the abilities of those skilled in the art. The photoresists may be developed using a variety of developer solutions. Suitable developer solutions include, but are not limited to, organic solvents and aqueous alkaline compositions. Exemplary aqueous alkaline compositions include, without limitation, tetraalkylammonium hydroxide-based compositions such as 0.15 to 0.26 N tetramethylammonium hydroxide ("TMAH"). Such developers are commercially available from a variety of sources, such as from Shipley Company.

When an organic planarizing layer is used, the pattern from the first photoresist layer is transferred to the planarizing layer. Such pattern transfer may be achieved by a variety of means such as by etching. The etching of the planarizing material may be performed by a variety of methods including wet etching and dry etching such as reactive ion etching, plasma etching and ion beam milling. In general, such etching step removes the portion of the planarizing layer exposed after patterning of the first photoresist layer. The etching step may be stopped after removal of the planarizing material, thus stopping at the substrate surface, or may optionally remove a portion of the substrate. Such etching techniques are conventional and are well within the abilities of those skilled in the art.

Prior to disposing the second photoresist, the pattern is rendered insensitive to the UV-radiation. The pattern may be rendered insensitive by curing the patterned first photoresist. By "curing" it is meant that the first photoresist is subjected to conditions that render it less soluble, and preferably insoluble, in the second photoresist, the developer solution used to develop the second photoresist or both. Such curing may be accomplished by exposure to UV radiation, heating, or a combination thereof. A variety of exposure doses and temperatures may be used to cure the first photoresist. For example, exposure doses of 10×Eo to 20×Eo may be used, as well as doses that are higher and lower than this. The first photoresist may be heated at a temperature of 100 to 130° C., although higher and lower temperatures may be used. In general, the photoresist is heated for 5 to 360 seconds.

When an organic planarizing layer is used, the pattern may alternatively be rendered insensitive to the UV radiation after transfer of the pattern to the planarizing layer by removing the first photoresist to provide a patterned planarizing layer. Such planarizing layer is typically insensitive to UV radiation. The first photoresist may be removed using any suitable resist stripper, such as those described below.

A wide variety of conductive materials may be used in the present invention, such as metals and conductive polymers. Metals are preferred and include alloys. Exemplary metals and alloys include, without limitation, gallium, arsenic, tantalum, tungsten, molybdenum, titanium, platinum, gold, silver, germanium, aluminum, copper, titanium-platinum-gold, and gold-germanium-platinum/gold. Various other metals and metal alloys may be advantageously used. Such conductive materials are deposited on the second photoresist. When a metal and/or alloy is the conductive material, it may be deposited by any suitable means, such as, but not limited to, sputtering, physical vapor deposition, and chemical vapor deposition.

In the present invention, the first and second photoresists may be removed by any suitable technique. For example, the photoresists may be removed by contacting them with a polymer remover composition for a period of time and at a temperature sufficient to remove the photoresists. Photoresists are generally contacted with the polymer remover at a temperature of 10° to 90° C. Typically, the temperature ranges from 15° to 85° C. and more typically from 20° to 85° C.

Exemplary contact times range from 5 seconds to 15 minutes, although shorter or longer times may be used. Typically, the contact time is from 5 to 300 seconds and more typically from 10 to 120 seconds. The particular time and temperature will depend upon the photoresist to be removed and the particular polymer remover composition.

Exemplary polymer removers include, but are not limited to, organic solvents, bases such as tetraalkylammonium hydroxides, fluoride ion sources such as hydrogen fluoride, ammonium fluoride and ammonium bifluoride, hydroxylamine, and alkanolamines. Such polymer removers may contain one or more additional components such as corrosion inhibitors, solvents, water, wetting agents, antifreeze agents, and thickening agents. Polymer removers are generally commercially available, such as from Shipley Company and EKC Technologies.

The second photoresist having a conductive material disposed thereon functions as a lift-off layer when removed. That is, removing the second photoresist by contacting it with a polymer remover also removes the conductive material that has been deposited on the surface of the second photoresist, leaving the conductive material that has been deposited within the first and second openings, i.e. the T-gate structure.

In a first embodiment (referred to as "double-coat process"), T-gate structures are formed according to a method including the steps of: a) providing a substrate; b) disposing a layer of a UV-sensitive first photoresist on the substrate, patterning the first photoresist by exposing the first photoresist to UV radiation through a mask and developing the exposed first photoresist to define a first opening for a base of the T-gate, and curing the patterned first photoresist; c) disposing a layer of a UV-sensitive second photoresist on the cured first photoresist wherein the second photoresist is negative-acting; d) patterning the second photoresist by exposing the second photoresist to the UV radiation through a mask and developing the exposed second photoresist to define a second opening for a cap of the T-gate over the first opening; and e) depositing a conductive material within the first and second openings to form a T-gate. The photoresist layers are then removed and function as lift-off layers by removing the conductive material deposited on the surface of the second photoresist. One or more layers of antireflective coatings and/or via-filling materials may be disposed between the substrate and the first photoresist.

In the double-coat process, the second photoresist is disposed on the first photoresist. The first photoresist is cured prior to the deposition of the second photoresist. In the double-coat process, the first photoresist is preferably negative-acting. In one embodiment of the double-coat process, the first photoresist and the second photoresist are the same. The substrate may optionally be etched in the double-coat process following patterning of the first photoresist layer, and preferably etched after patterning of the second photoresist layer. Any of the above described etching techniques may be used to etch the substrate.

Figure 2A:
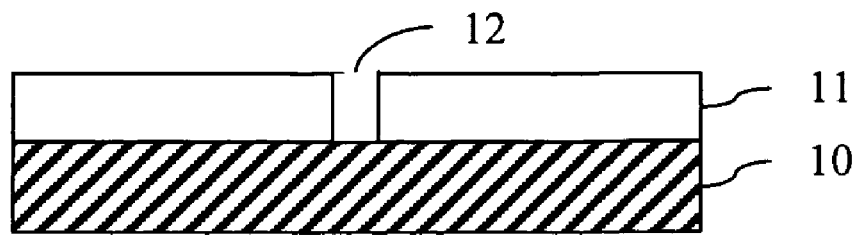
FIGS. 2A-2F are a schematic cross-sectional illustration of a process for forming a T-gate according to one embodiment of the invention.
Figure 2B:
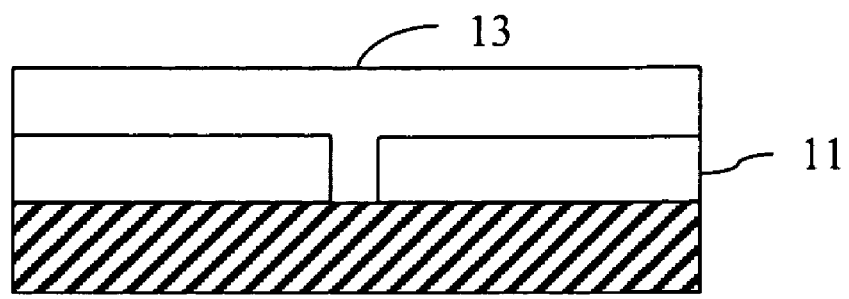
Figure 2C:
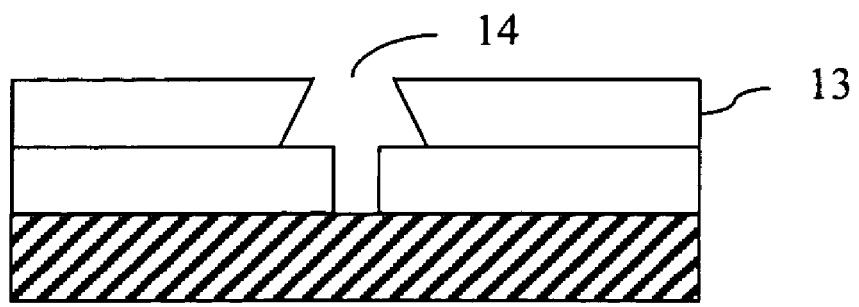
Figure 2D:
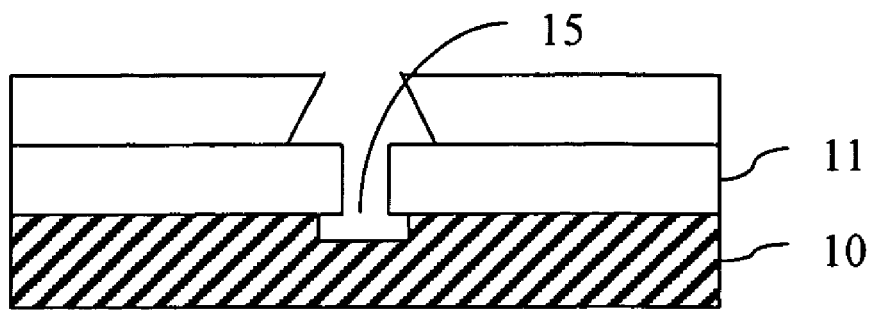
Figure 2E:
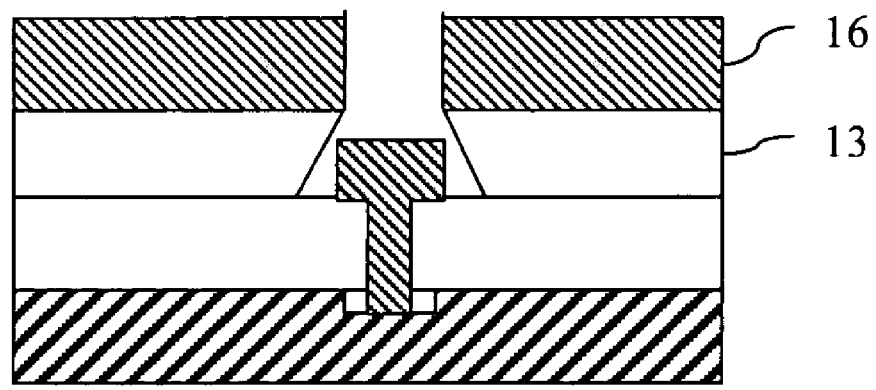
Figure 2F:
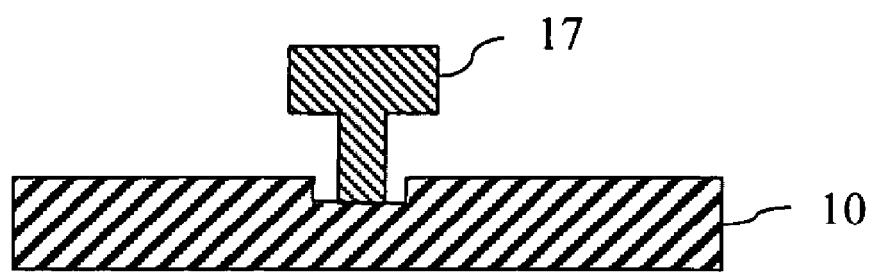

FIGS. 2A-2E illustrate the double-coat process of the present invention. First photoresist 11, typically a negative-acting photoresist, is disposed on substrate 10, such as GaAs or silicon. First photoresist 11 is then exposed to UV-radiation, such as 248 nm radiation, through a mask and developed, such as with 0.26 N TMAH, to pattern first photoresist 11 and define first opening 12 fore the base of the T-gate structure. See FIG. 2A. First photoresist 11 is then cured using heat and light and a layer of second photoresist 13 is disposed on cured first photoresist 11. See FIG. 2B. Second photoresist 13 is then patterned to define second opening 14 for the top of the T-gate by exposing second photoresist 13 to UV-radiation through a mask, the UV-radiation being the same as that used to expose first photoresist 11, and then developing second photoresist 13. The patterning of second photoresist 13 is performed in a manner to provide second opening 14 having an undercut profile as illustrated in FIG. 2C. Such undercut profile assists in the lift-off of subsequently deposited conductive material. Optionally, a portion of substrate 10 exposed by the first and second openings is etched as illustrated by recess 15 which is illustrated in FIG. 2D as undercutting the opening in first photoresist 11. Gate metallization layer 16 (conductive material) is then deposited within the first and second openings as well as over the surface of second photoresist layer 13. See FIG. 2E. The first and second photoresists are then removed by contacting the device with a polymer remover. The second photoresist functions to lift-off the gate metallization layer covering the surface of the second photoresist leaving T-gate structure 17 on substrate 10, as illustrated in FIG. 2F.

In a second embodiment (referred to as "bi-layer process"), T-gate structures are formed according to a method including the steps of: a) providing a substrate; b) disposing a layer of a planarizing material on the substrate, disposing a layer of a UV-sensitive first photoresist on the planarizing material layer, patterning the first photoresist by exposing the first photoresist to UV radiation through a mask and developing the exposed first photoresist to define a first opening for a base of the T-gate, transferring the first opening to the planarizing material layer, and optionally removing the first photoresist to provide a patterned planarizing material layer; c) disposing a layer of a UV-sensitive second photoresist wherein the second photoresist is negative-acting; d) patterning the second photoresist by exposing the second photoresist to the UV radiation through a mask and developing the exposed second photoresist to define a second opening for a cap of the T-gate over the first opening; and e) depositing a conductive material within the first and second openings to form a T-gate. The second photoresist is then removed.

In one embodiment of the present bi-layer process, the first photoresist is positive-acting. In another embodiment of the bi-layer process, the first photoresist is negative acting. In a further embodiment of the bi-layer process, the first photoresist is positive-acting and contains a polymer including silsesquioxane units.

Figure 3A:
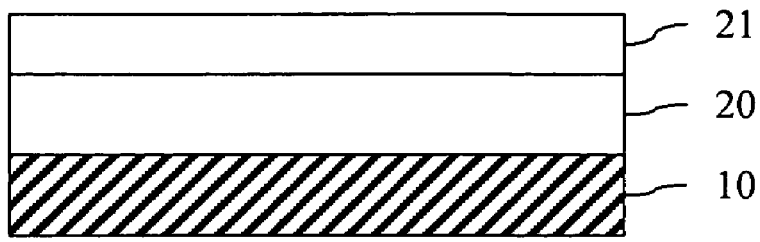
FIGS. 3A-3H are a schematic cross-sectional illustration of a process for forming a T-gate according to another embodiment of the invention.
Figure 3B:
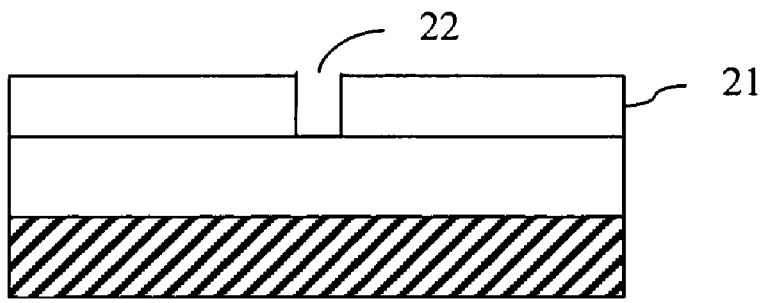
Figure 3C:
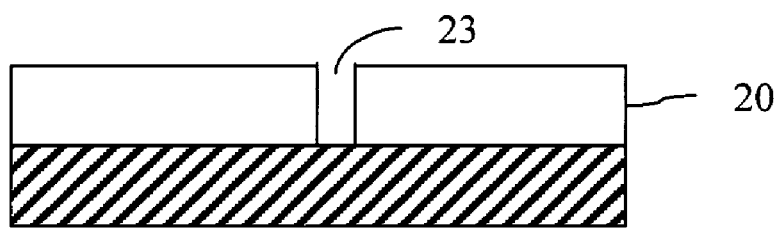
Figure 3D:
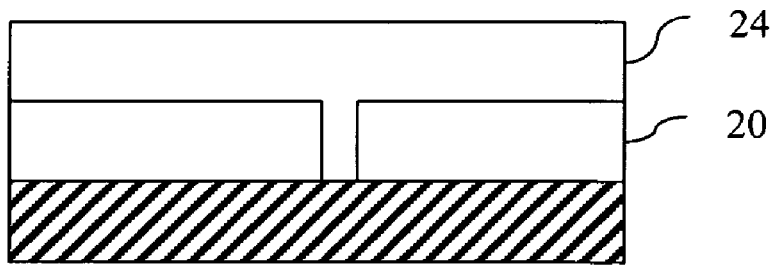
Figure 3E:
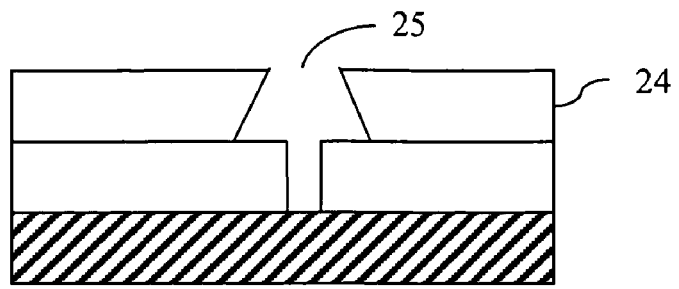
Figure 3F:
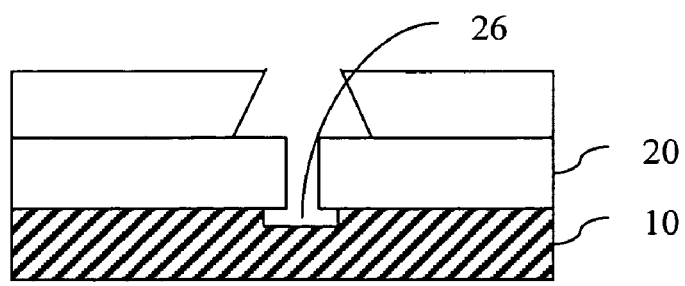
Figure 3G:
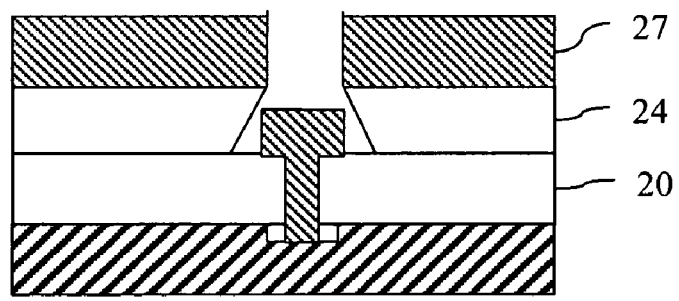
Figure 3H:
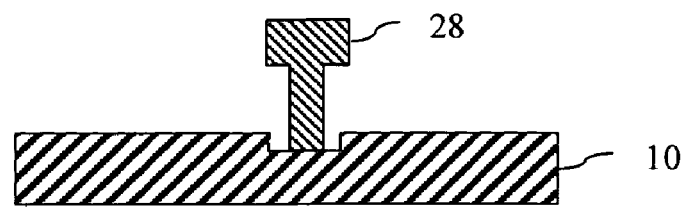

FIGS. 3A-3H illustrate the bi-layer process of the present invention. A layer of a polymeric antireflective coating 20, such as AR™2450 underlayer available from Shipley Company, is spin coated to a thickness of 200 to 250 nm on substrate 10, such as GaAs or silicon. Antireflective coating 20 contains a phenolic moiety, a thermal acid generator and a cross-linking agent. After spin-coating, antireflective coating 20 is baked and sufficiently cured to prevent intermixing with subsequently applied photoresists. First photoresist 21 is spin coated on antireflective coating 20 to a thickness of, e.g., up to 250 nm. First photoresist 21 may be a positive-acting photoresist such as SR™2420 which is a silsesquioxane-containing photoresist available from Shipley Company. See FIG. 3A. First photoresist 21 is patterned to define aperture 22 by exposing first photoresist to UV radiation through a mask using a PAS5500/300 tool and then developing the exposed first photoresist. See FIG. 3B. Antireflective coating 20 is then etched to form first opening 23 for the base of the T-gate and then first photoresist 21 is removed, such as by contact with a fluoride-based polymer remover such as PRx417 available from Shipley Company. Negative-acting second photoresist 24 is then spin coated to a thickness of approximately 900 nm on patterned antireflective coating 20, as illustrated in FIG. 3D. An exemplary second photoresist is UVN™30, available from Shipley Company. Second photoresist 24 is patterned to define second opening 25 for the top of the T-gate by exposing second photoresist 24 to UV-radiation through a mask, the UV-radiation being the same as that used to expose first photoresist 21, and then developing second photoresist 24. The patterning of second photoresist 24 is performed in a manner to provide second opening 25 having an undercut profile as illustrated in FIG. 3E. Optionally, a portion of substrate 10 exposed by the first and second openings is etched as illustrated by recess 26 which is shown in FIG. 3F as undercutting the opening in antireflective coating 20. A gate metallization layer (conductive material) 27 is then deposited within the first and second openings as well as over the surface of the second photoresist layer. See FIG. 3G. The second photoresist and the antireflective coating are then removed by contacting the device with a polymer remover. The second photoresist functions to lift-off the gate metallization layer covering the surface of the second photoresist leaving T-gate structure 28 on substrate 10, as illustrated in FIG. 3H.

The following example is expected to further illustrate various aspects of the present invention, but is not intended to limit the scope of the invention in any aspect.

EXAMPLE

Figure 4:
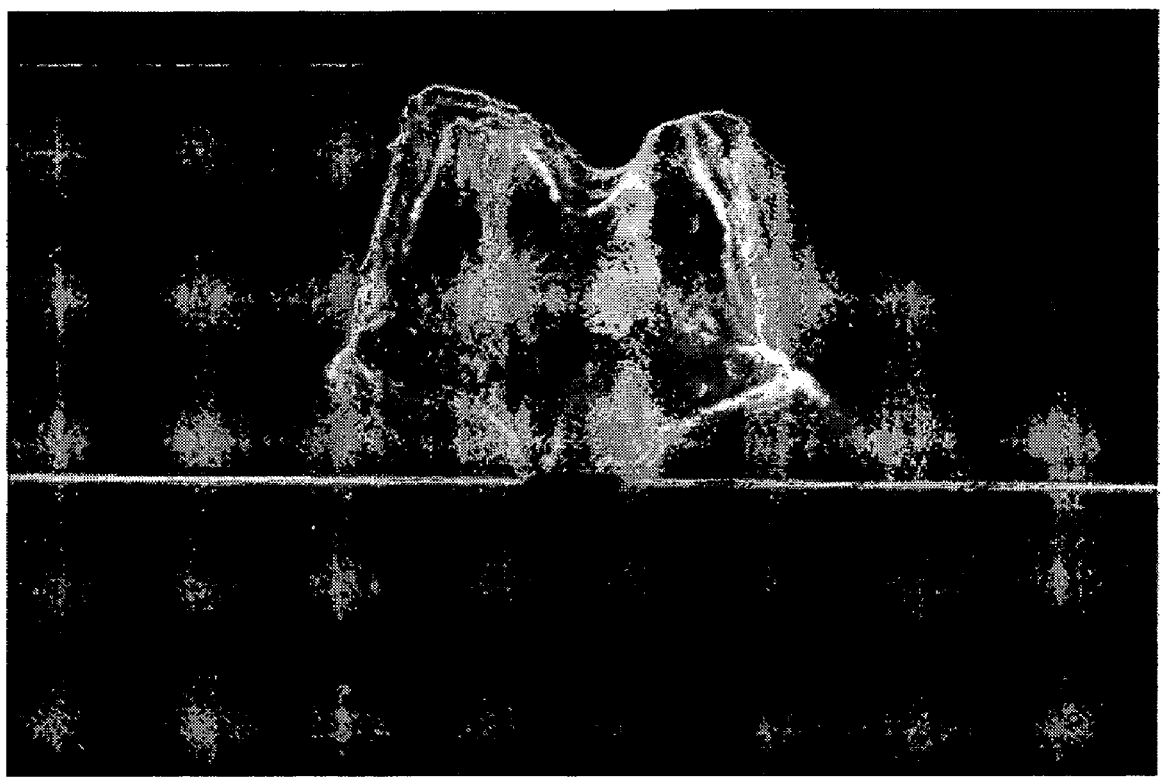
FIG. 4 is a scanning electron micrograph of a T-gate structure made by the present invention.

A layer of negative-acting photoresist (UVN™ 30, Shipley Company) was spin coated on a gallium arsenide substrate to a thickness of approximately 200 nm. The photoresist was patterned by exposure to UV radiation at 248 nm through a mask using a PAS5500/300 tool followed by development using 0.26 N TMAH for 10 seconds to provide approximately 150 nm openings for the base of the T-gate. The photoresist layer was then cured by flood exposure of 200 mJ (approximately 15×Eo) followed by heating at 115° c for 60 seconds. A second layer of a negative acting photoresist (UVN™ 30) was spin coated to a thickness of approximately 700 nm on the cured first photoresist layer. The second photoresist layer was then patterned in the same way as the first photoresist layer (248 nm) to define a second opening for the top (or cap) of the T-gate over the first opening. Next, a gate metallization layer was deposited by vapor deposition. The gate metallization layer was titanium-platinum-gold. Next, the first and second photoresist layers were removed by contacting them with a TMAH-containing polymer remover. The second photoresist layer acted as a lift-off layer, removing the gate metallization layer that was deposited over the surface of the second photoresist layer. The resulting T-gate structure, shown in FIG. 4, had a stem CD of approximately 200 nm, a cap CD of approximately 600 nm, and a total height of approximately 500 nm.

What is claimed is:

1. A method for forming a T-gate on a substrate comprising the steps of:
    a) providing a substrate;
    b) disposing a layer of a UV-sensitive first photoresist the substrate;
    c) patterning the first photoresist by exposing the first photoresist to UV radiation through a mask and developing the exposed first photoresist to define a first opening for a base of the T-gate;
    d) rendering the pattern insensitive to the UV-radiation;
    e) disposing a layer of a UV-sensitive second photoresist, the second photoresist being negative-acting;
    f) patterning the second photoresist by exposing the second photoresist to the UV radiation through a mask to create an undercut profile and developing the exposed second photoresist to define a second opening for a cap of the T-gate over the first opening; and
    g) depositing a conductive material within the first and second openings to form a T-gate.

2. The method of claim 1 wherein the UV radiation has a wavelength of 190 to 300 nm.

3. The method of claim 1 wherein the step of rendering the pattern insensitive to the UV radiation comprises curing the first photoresist.

4. The method of claim 1 further comprising the step of removing the second photoresist.

5. The method of claim 1 wherein the second photoresist layer has a thickness greater than that of the first photoresist layer.

6. The method of claim 1 wherein the first photoresist is negative acting.

7. The method of claim 1 further comprising the step of disposing an organic planarizing layer on the substrate prior to the step b) and transferring the pattern to the planarizing layer prior to step d).

8. The method of claim 7 wherein the organic planarizing layer is chosen from a via-filling layer and an antireflective coating layer.

9. The method of claim 1 where in the first photoresist and the second photoresist are the same.

10. A method for forming a T-gate structure comprising the steps of:
    a) providing a substrate;
    b) disposing a layer of a UV-sensitive first photoresist on the substrate; patterning the first photoresist by exposing the first photoresist to UV radiation through a mask and developing the exposed first photoresist to define a first opening for a base of the T-gate; and curing the patterned first photoresist;
    c) disposing a layer of a UV-sensitive second photoresist on the cured first photoresist wherein the second photoresist is negative-acting;
    d) patterning the second photoresist by exposing the second photoresist to the UV radiation through a mask to create an undercut profile and developing the exposed second photoresist to define a second opening for a cap of the T-gate over the first opening;
    e) depositing a conductive material within the first and second openings to form a T-gate; and
    f) removing the first and second photoresists.

11. The method of claim 10 wherein the first photoresist is negative acting.

12. The method of claim 10 wherein the UV radiation has a wavelength of 248 nm.

13. A method for forming a T-gate structure comprising the steps of:
    a) providing a substrate;
    b) disposing an organic planarizing layer on the substrate, disposing a layer of a UV-sensitive first photoresist on the organic planarizing layer, patterning the first photoresist by exposing the first photoresist to UV radiation through a mask and developing the exposed first photoresist to define a first opening for a base of the T-gate, transferring the first opening to the organic planarizing layer, and removing the first photoresist to provide a patterned organic planarizing layer;
    c) disposing a layer of a UV-sensitive second photoresist on the patterned organic planarizing layer wherein the second photoresist is negative-acting;
    d) patterning the second photoresist by exposing the second photoresist to the UV radiation through a mask to create an undercut profile and developing the exposed second photoresist to define a second opening for a cap of the T-gate over the first opening;

e) depositing a conductive material within the first and second openings to form a T-gate; and f) removing the second photoresist.

14. The method of claim 13 wherein the UV radiation has a wavelength of 248 nm.

15. The method of claim 13 wherein first photoresist is negative acting.

16. The method of claim 13 wherein the organic planarizing layer is chosen from a via-filling layer and an antireflective coating layer.

* * * * *